United States Patent
Hengst

[11] Patent Number: 5,931,666
[45] Date of Patent: Aug. 3, 1999

[54] SLIP FREE VERTICAL RACK DESIGN HAVING ROUNDED HORIZONTAL ARMS

[75] Inventor: Richard R. Hengst, Oakham, Mass.

[73] Assignee: Saint-Gobain Industrial Ceramics, Inc., Worcester, Mass.

[21] Appl. No.: 09/031,887

[22] Filed: Feb. 27, 1998

[51] Int. Cl.[6] .................................................. F27D 5/00
[52] U.S. Cl. ...................... 432/258; 432/253; 211/41.18; 206/454
[58] Field of Search .................... 432/253, 258, 432/259, 261; 211/41.18; 206/454; 269/40

[56] References Cited

U.S. PATENT DOCUMENTS

| | | | |
|---|---|---|---|
| 3,756,581 | 9/1973 | Albertini | 432/2 |
| 4,802,842 | 2/1989 | Hirayama | 432/253 |
| 5,169,453 | 12/1992 | Takagi | 118/500 |
| 5,219,079 | 6/1993 | Nakamura | 211/41 |
| 5,316,472 | 5/1994 | Niino et al. | 432/241 |
| 5,393,226 | 2/1995 | Groom | 432/258 |
| 5,431,561 | 7/1995 | Yamabe et al. | 432/253 |
| 5,492,229 | 2/1996 | Tanaka et al. | 211/41 |
| 5,534,074 | 7/1996 | Koons | 206/454 |
| 5,586,880 | 12/1996 | Ohsawa | 432/258 |
| 5,725,101 | 3/1998 | Kakizaki et al. | 206/454 |

FOREIGN PATENT DOCUMENTS

807961A1  11/1997  European Pat. Off. .

*Primary Examiner*—Teresa Walberg
*Assistant Examiner*—Gregory A. Wilson
*Attorney, Agent, or Firm*—Thomas M. DiMauro

[57] ABSTRACT

The invention relates to a vertical rack for semiconductor wafer processing having strictly horizontally disposed arms wherein each arms has a rounded tip.

14 Claims, 3 Drawing Sheets

SLIP FREE VERTICAL RACK DESIGN HAVING ROUNDED HORIZONTAL ARMS

BACKGROUND OF THE INVENTION

The manufacture of semiconductor devices such as integrated circuits typically requires heat treating silicon wafers in the presence of reactive gases. During this process, the temperatures and gas concentrations to which the devices are exposed must be carefully controlled, as the devices often include circuitry elements less than 1 um in size which are sensitive to minute variations in the processing environment.

The semiconductor manufacturing industry typically processes these wafers in either horizontal or vertical carriers. The horizontal carrier, typically called a "boat", has three or four horizontally disposed bars arranged in a semicircle design, with each bar having inwardly facing grooves set therein at regular intervals. Each set of grooves define a vertical space for carrying a vertically disposed wafer. The vertical carrier, typically called a "vertical rack", has three or four vertically disposed rods (or posts) arranged in a semicircle design, with each post having slots set therein at regular intervals to define a space for supporting a horizontally disposed wafer. To insure the geometrical precision required in this field, the three or four rods are fixed to a top plate and a bottom plate. The portions of the post between each slot, termed "teeth", are identically spaced in order to support wafers at regular intervals from and parallel to the bottom plate. The entire rack is then placed within a vertical furnace for processing the wafers.

Because a wafer processed on a vertical rack experiences less of a temperature gradient over its face (as compared to a wafer processed in a horizontal boat), semiconductor manufacturers are increasingly turning to vertical furnaces. There is, however, a drawback to vertical furnacing. The wafers disposed on a conventional vertical rack are supported at their outside edge only. As such, the areas of the wafer resting on these teeth experience higher stress than the rest of the wafer.

When temperatures in the furnace exceed about 1000° C., these stresses often become significant and portions of the single crystal wafer move relative to each other along crystallographic plates in response to that stress. This phenomenon, called "slip", effectively destroys the value of the semiconductor devices located in the area of the wafer where slip has occurred.

In response to the slip problem, the art has developed a host of vertical racks having extended, vertically-inclined teeth, whereby a horizontally-disposed wafer supported thereon is supported only in a region near its center. See e.g., U.S. Pat. No. 5,492,229 ("Tanaka"), FIG. 2b of WO 96/35228 ("Tomanovich") and FIGS. 5–7 of U.S. Pat. No. 5,586,880 ("Ohsawa"). These configurations provide what the art has termed "near-center support". Although the rack which produces "near center support" has eliminated slip in many wafer processing applications, it is somewhat inefficient, as the portion of its arm which rises from the horizontal plane to produce the near-center support necessarily increases the vertical spacing period of the rack, that is, the wafer-to-wafer distance. Tanaka, for example, specifically teaches that its riser vertically extend at least about 0.3 mm from the flat portion of the tooth. Accordingly, the near-center support style of vertical rack can typically accommodate only about 90% of the wafers typically accommodated by the conventional vertical rack.

FIG. 3(b) of Tomanovich discloses a vertical rack wherein the arms are strictly horizontal and do not rise. Although this rack has been found to eliminate slip in some high temperature semiconductor wafer processing applications, it performs less well in more demanding applications.

Therefore, there is a need for a vertical rack which is as efficient as the conventional style rack and yet eliminates slip in more demanding wafer processing applications.

SUMMARY OF THE INVENTION

The rack of the present invention comprises an arm which first extends strictly horizontally from the vertical rod and then slopes gently downward. Preliminary experiments involving the rack of the present invention have shown that it has essentially eliminated slip in 200 mm silicon wafers in a 1200° C. wafer processing application. By contrast, a similarly dimensioned vertical rack having strictly horizontal arms (i.e., FIG. 3b of Tomanovich) produced slip in about 50% of the wafers in the same processing application.

Therefore, the rack of the present invention is more compact and efficient than the near-center support racks (as it has no riser) and is more effective at preventing slip than the strictly horizontal arm rack.

The exceptional performance of this rack is surprising in that its design would appear to encourage slip but in fact prevents slip. Specifically, the near center support racks seek to prevent slip by preventing too much sag in the inner portions of the wafer. By providing a gently downsloping edge (or "rounded") portion, the rack of the present invention appears to promote sag in the inner portions of the wafer. However, this design has demonstrated effectiveness in preventing slip.

Without wishing to be tied to a theory, it is believed that the design of the present invention takes advantage of the monocrystalline nature of the silicon wafer. Specifically, the silicon wafer responds elastically in semiconductor wafer processing by slightly sagging as it is exposed to high temperatures and then regaining its initial flatness as it cools. It appears that only when the sagging wafer is also confronted with a region of stress concentration (i.e., its sag is interrupted by a sharp supporting edge) does it produce slip. Because the edge of the support arm of the present invention is rounded, the slightly sagging wafer is supported about an increased surface area whose pitch essentially eliminates (or substantially reduces) stress concentration. It is believed that both the increased surface area (which provides more support to the sagging wafer) and the rounded nature of the edge (which prevents stress concentration) each have a role in the successful application of this rack.

Although FIGS. 5–6 of Ohsawa disclose a rack whose arms have a downward sloping edge, the accompanying text makes it clear this rack provides only near center support. That is, the text teaches that construction of the arm proceeds by first making a transverse hole through the rod and then making a horizontal platform which connects to the hole, but does so above the bottom of the hole to produce a riser. This riser makes the rack inefficient for the reasons explained above. Ohsawa does not teach or suggest eliminating the hole-making first step to eliminate its riser.

Therefore, in accordance with the present invention, there is provided a vertical rack made of a ceramic having an iron concentration of no more than about 50 ppm and comprising:

a) a vertical support means comprising a generally horizontal base and an vertical portion extending vertically therefrom, b) a plurality of vertically spaced, horizontal support means horizontally extending from the vertical portion, wherein at least one horizontal support means comprises:
i) a horizontal upper surface portion which extends continuously horizontally from the vertical portion, and
ii) a rounded upper surface portion sloping downward from the horizontal upper surface portion.

Preferably, the vertical portion of the vertical rack further comprises an arcuate horizontal cross-section defining a maximum radius $R_{max}$ having a centerpoint, the plurality of vertically spaced, horizontal support means horizontally extend from the vertical portion substantially towards the centerpoint, the horizontal upper surface portion extends continuously horizontally from the vertical portion towards the centerpoint for a distance of at least 20% of $R_{max}$, and the rounded upper surface portion slopes downward from the horizontal upper surface portion towards the centerpoint.

Also in accordance with the present invention, there is provided a combination comprising:
a) the above rack, and
b) a plurality of wafers having a wafer radius of no more than Rmax, wherein each wafer is horizontally supported by one of the plurality of horizontal support means.

Also in accordance with the present invention, there is provided a process for treating semiconductor wafers, comprising the steps of:
a) providing the above combination wherein each wafer has an $R_{max}$ of at least 200 mm, and
b) raising the temperature of semiconductor wafers to at least 1000° C. for at least 15 minutes.

DETAILED DESCRIPTION OF THE INVENTION

Figure 1:
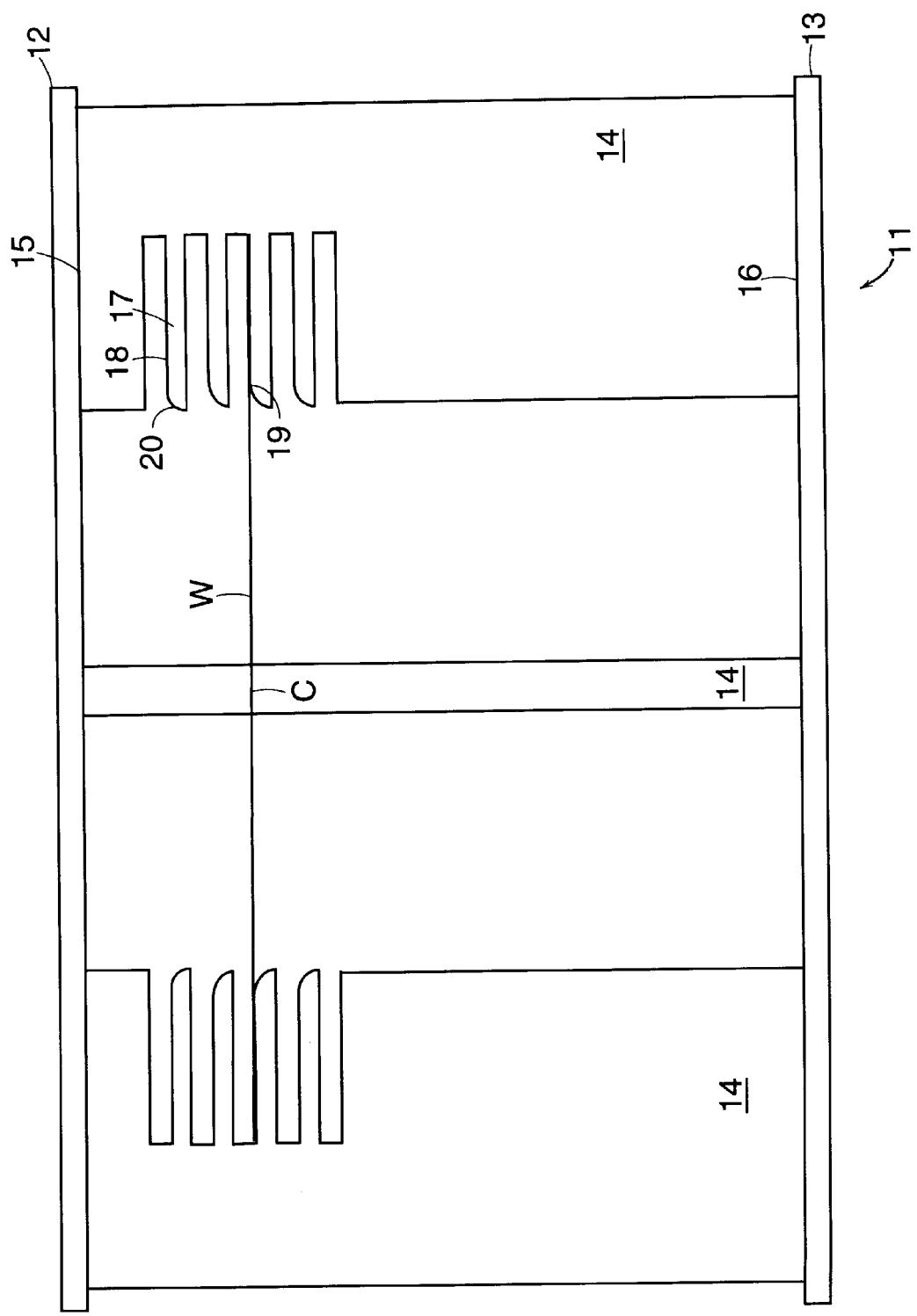
FIG. 1 is a side view of the vertical rack of the present invention supporting a horizontally disposed wafer.

Referring now to FIG. 1, there is provided a preferred vertical rack 11/wafer W combination, the vertical rack comprising:
a) a top plate 12,
b) a bottom plate 13, and
c) a plurality of vertical rods 14, the upper end 15 of each rod being fixed about the periphery of the top plate 12 and the lower end 16 of each rod being fixed about the periphery of the bottom plate 13, each of the vertical rods having a plurality of horizontal arms 17 spaced equidistantly from the bottom plate 13 to define a plurality of support levels for horizontally supporting the wafers W, each wafer having a centerpoint C,
wherein each arm comprises:
a) a horizontal upper surface portion 18 which extends continuously horizontally from the rod and continuously contacts the wafer W from the wafer edge such that the innermost contact 19 between the arm and the wafer is in the region between 20% and 80% of the wafer radius, measured from the wafer radius, and
b) a rounded upper surface portion 20 sloping downward from the horizontal upper surface portion 18 towards the wafer centerpoint C.

Figure 2:
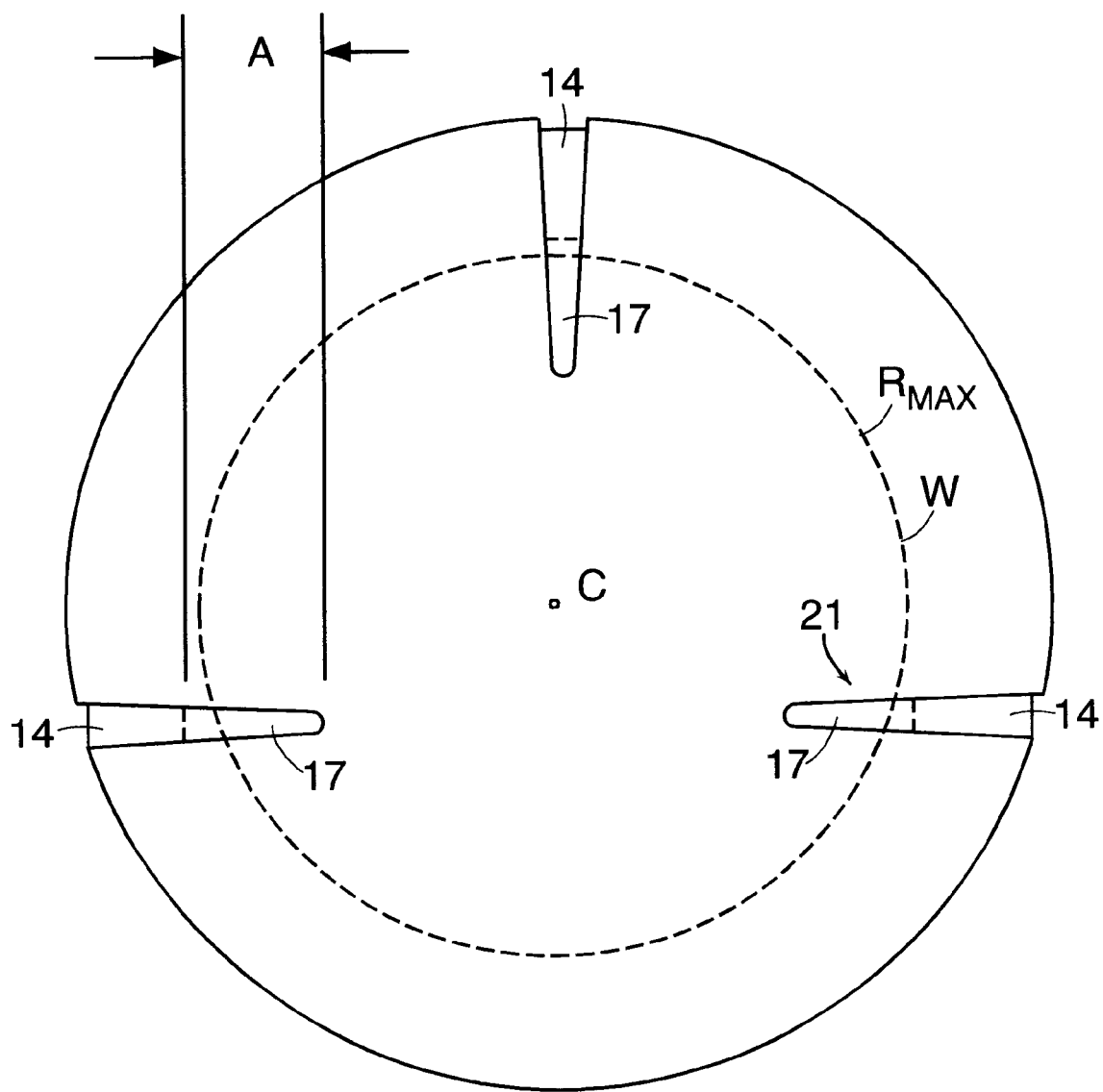
FIG. 2 is a top view the preferred vertical rack/wafer combination of FIG. 1.

FIG. 2 shows how the rods 14 are oriented to form a horizontal cross-section defining a maximum radius $R_{max}$ (as shown by the dotted line) having a centerpoint C. In this Figure, the dotted line would also correspond to the largest wafer which could be accommodated by the rack.

In one preferred embodiment, the innermost contact between at least one and preferably each of at least three of the arms and their supported wafer is in the region of between 33% and 66% of the wafer radius. Moreover, the total contact area between the arms of one support level and their supported wafer is typically between about 1% and about 5% of the surface area of the wafer face which contacts the arms.

To minimize slip-inducing stress, the surfaces of the arms upon which the wafers are supported (i.e., both the horizontal portion of the arm and its downsloping edge) should have a surface roughness Ra of no more than 1 um, as defined by Section 3.9.1 of ANSI/ASME National Standard B46.1-1985. If the smoothness of the horizontal portion is about 2 um, then when the wafer expands during heat up, the peak portions of the arms will prevent the smooth expansion of the wafer and this phenomenon will cause slip.

As the frequency of slip generally increases as the industry moves to larger diameter wafers, the advantages of using the rack of the present invention are more clearly demonstrated in applications having those larger diameter wafers. Accordingly, the rack of the present invention is more advantageously used when processing wafers having a diameter of at least 200 mm (about 8 inch), more advantageously with wafers having a diameter of at least 250 mm (about 10 inch), and most advantageously with wafers having a diameter of at least 300 mm (about 12 inch). Accordingly, vertical racks of the present invention whose vertical rods define a wafer supporting diameter of at least 200 mm provide special advantage. More advantage is provided when the vertical rods define a wafer supporting diameter of at least 250 mm, and even greater advantage is provided when the vertical rods define a wafer supporting diameter of at least 300 mm.

Similarly, as the frequency of slip generally increases as the industry moves to higher processing temperatures, the advantages of using the rack of the present invention are more clearly demonstrated in applications having those higher processing temperatures. Accordingly, the rack of the present invention is more advantageously used when the temperature of the wafer becomes at least about 1000° C. for at least 15 minutes. More advantage is provided when the temperature of the wafer becomes at least about 1100° C. and even greater advantage is provided when the temperature of the wafer becomes at least about 1200° C. for at least 30 minutes.

Although it is desirable that the arm extend from the rod at a perfectly horizontal angle, such perfection is rarely achieved commercially. Accordingly, the angle of deviation of the horizontal upper surface portion of the arm from horizontal (as defined by the base) is typically between about 0° and 0.2° degrees. By staying within this tolerance, the efficiency of the flat arm is retained.

The rounded edge of the arm not only provides an increased support area for the wafer during its critical sagging state, but also is free of stress concentrating features. The curvature of the rounded edge is preferably substantially hemispherical and defines a radius R of between 3 mm and 50 mm, more preferably between 5 mm and 20 mm. Its surface roughness Ra is generally no more than about 2 um, preferably no more than 1 um. In one preferred embodiment, the rounded edge provides a downward sloping support face having a grade of about 1/10 (i.e., it slopes downward about 0.5 mm over the last 5 mm of the arm). Generally, the rounded edge provides a downward sloping support face having a grade of between about 1/30 and 1/3.

In some embodiments, as shown in FIG. 2, the lateral edges 21 of the arms are rounded.

The distance which the horizontal upper surface portion typically extends from its vertical rod (found by measuring the shortest distance between the end of the projection and the rod and shown as "A" in FIG. 2) is generally dependent upon the size of the wafer to be processed. For example, when the wafer to be processed has a 6 inch diameter, the horizontal upper surface portion typically terminates at least 15 mm from the edge of the rod, usually between about 20 mm and about 40 mm from the rod, and preferably about 27 mm from the edge of the rod. When the wafer to be processed has an 8 inch diameter, the horizontal upper surface portion typically terminates at least 22 mm from the edge of the rod, usually between about 30 mm and about 50 mm from the rod, and preferably about 36 mm from the edge of the rod. When the wafer to be processed has an 12 inch diameter, the horizontal upper surface portion typically terminates at least 30 mm from the edge of the rod, usually between about 40 mm and about 70 mm from the rod, and preferably about 54 mm from the edge of the rod.

Typically, the horizontal upper surface portion of the arm supports the wafer from its periphery to a distance corresponding to between 20% and 80% of the supported wafer radius, more typically between 33% and 66% of the wafer radius.

The vertical rack of the present invention can be made from any ceramic material having an iron purity which allows its use in the high temperature production of vertical racks for semiconductor processing. Preferably, the material is recrystallized silicon carbide. More preferably, the recrystallized silicon carbide component has less than 10 ppm iron. The rack material may also be CVD coated with refractory materials such as silicon carbide, silicon nitride or diamond. Preferably, the rack comprises CRYSTAR, a recrystallized silicon carbide available from the Norton Company of Worcester, Mass. In preferred embodiments, the rack material comprises siliconized silicon carbide. In preferred embodiments, the rack material has a 1200° C. flexural strength (4 point) of at least 150 MPa.

Figure 3:
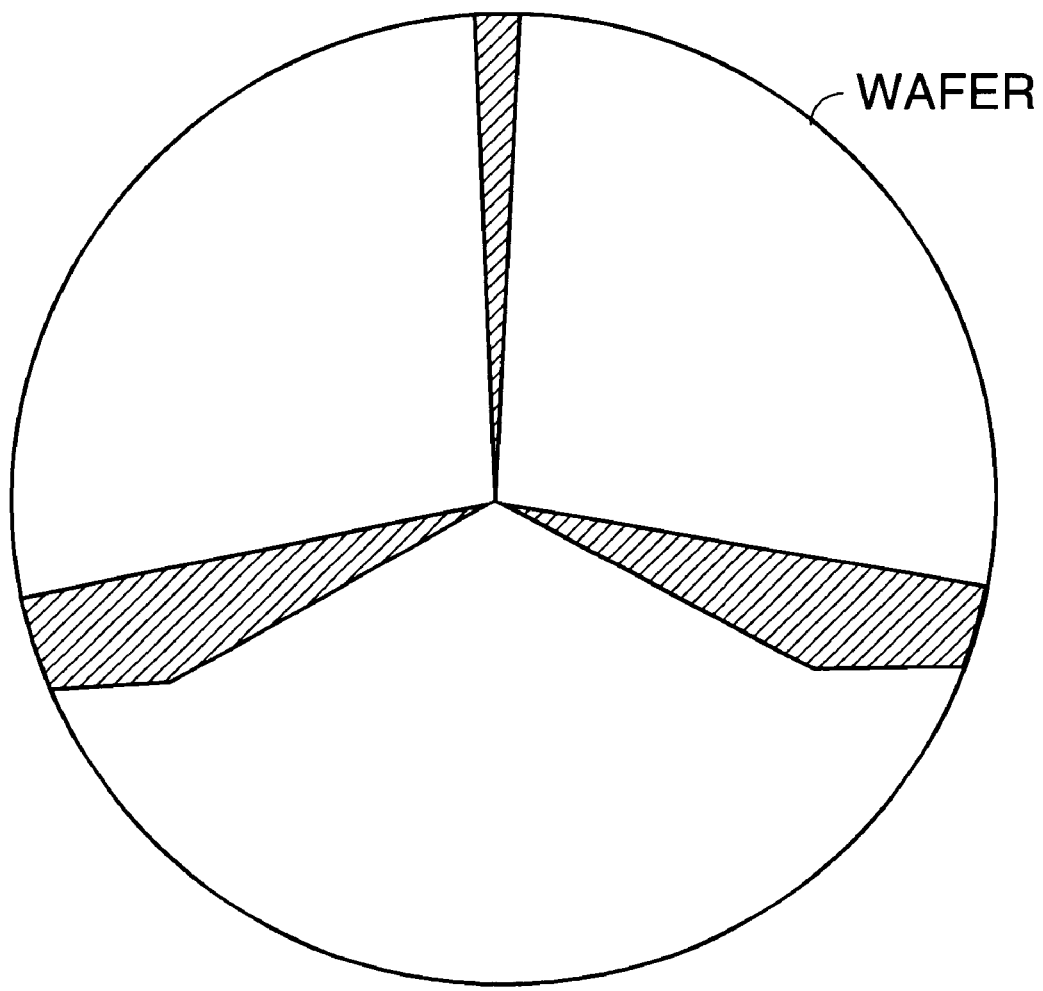
FIG. 3 presents the areas of shadow produced by the preferred vertical rack of the present invention, as described by FIG. 2.

It has been observed that the arms of vertical racks typically shield, or "shadow", radiant heat and/or reactive gases (which enter from the periphery of the vertical furnace) from the portions of the wafer inside of and adjacent to the posts. Accordingly, significant variations in temperature and/or gas concentration between the "shadowed" portion of the wafer and the rest of the wafer are produced. These variations contribute to slip-inducing stress. Therefore, in some embodiments, the arms are radially oriented such that they cast a shadow on no more than 30% of the wafer, preferably no more than 10% of the wafer. For the purposes of the present invention, the shadow percentage is calculated by determining the percentage of the wafer face to which reactant gases and/or heat can directly radially proceed from the rack periphery in a path unobstructed by the arms. The shaded portion of FIG. 3 represents the shadow produced by the rods of FIG. 2 upon the wafer.

I claim:

1. A vertical rack made of a ceramic having an iron concentration of no more than about 50 ppm and comprising:

a) a vertical support means comprising a generally horizontal base and an vertical portion extending vertically therefrom,
b) a plurality of vertically spaced, horizontal support means horizontally extending from the vertical portion, wherein at least one horizontal support means comprises:
  i) a horizontal upper surface portion which extends continuously horizontally from the vertical portion and has a surface roughness Ra of no more than 1 micron ($\mu$m), and
  ii) a rounded upper surface portion sloping downward from the horizontal upper surface portion.

2. The vertical rack of claim 1 wherein the vertical portion further comprises an arcuate horizontal cross-section defining a maximum radius $R_{max}$ having a centerpoint, wherein the plurality of vertically spaced, horizontal support means horizontally extend from the vertical portion substantially towards the centerpoint, wherein the horizontal upper surface portion extends continuously horizontally from the vertical portion towards the centerpoint for a distance of at least 20% of $R_{max}$, and wherein the rounded upper surface portion slopes downward from the horizontal upper surface portion towards the centerpoint.

3. The rack of claim 2 wherein the base is a plate, and the vertical support means comprises at least three vertical rods.

4. The rack of claim 3 wherein each vertically spaced, horizontal supports means comprises a plurality of arms, wherein one arm extends horizontally from a single corresponding rod.

5. The rack of claim 4 wherein the vertical support means comprises no more than three vertical rods.

6. The rack of claim 1 wherein each vertically spaced, horizontal supports means comprises a plurality of arms, wherein one arm extends continuously horizontally from each of the at least three vertical rods, and at least one arm has rounded lateral edges.

7. The rack of claim 1 wherein $R_{max}$ is at least about 200 mm and the ceramic has a four point flexural strength of at least 150 MPa at 1200° C.

8. The rack of claim 1 wherein the rounded upper surface portion defines a radius of between 3 mm and 50 mm.

9. A combination comprising:

a) a vertical rack made of a ceramic having an iron concentration of no more than about 50 ppm and comprising:
  i) a vertical support means comprising a generally horizontal base and an vertical portion extending vertically therefrom,
  ii) a plurality of vertically spaced, horizontal support means horizontally extending from the vertical portion,
    wherein at least one horizontal support means comprises:
      -) a horizontal upper surface portion which extends continuously horizontally from the vertical portion and has a surface roughness Ra of no more than 1 $\mu$m, and
      -) a rounded upper surface portion sloping downward from the horizontal upper surface portion,
b) a plurality of wafers having a wafer radius of slightly less than $R_{max}$,
  wherein each wafer is horizontally supported by one of the plurality of horizontal support means.

10. The combination of claim 9 wherein the vertical portion of the rack further comprises an arcuate horizontal cross-section defining a maximum radius $R_{max}$ having a centerpoint, wherein the plurality of vertically spaced, horizontal support means horizontally extend from the vertical portion substantially towards the centerpoint, wherein the horizontal upper surface portion extends continuously horizontally from the vertical portion towards the centerpoint for a distance of at least 20% of $R_{max}$, and wherein the rounded upper surface portion slopes downward from the horizontal upper surface portion towards the centerpoint, the horizontal support of each wafer defines a point of innermost contact between each horizontal support means and its supported wafer, and wherein the point of innermost contact is in the region of between 20% of 80% of the wafer radius.

11. The combination of claim 10 wherein each wafer has a radius of at least 200 mm.

12. The combination of claim 9 wherein the rack is made of a ceramic having a four point flexural strength of at least 150 MPa at 1200° C.

13. A process for treating semiconductor wafers, comprising the steps of:
   providing the combination comprising:
      a) a vertical rack made of a ceramic having an iron concentration of no more than about 50 ppm and comprising:
         i) a vertical support means comprising a generally horizontal base and an vertical portion extending vertically therefrom,
         ii) a plurality of vertically spaced, horizontal support means horizontally extending from the vertical portion,
            wherein at least one horizontal support means comprises:
               -) a horizontal upper surface portion which extends continuously horizontally from the vertical portion and has a surface roughness Ra of no more than 1 μm, and
               -) a rounded upper surface portion sloping downward from the horizontal upper surface portion, and
      b) a plurality of wafers having a wafer radius of slightly less than $R_{max}$, wherein each wafer is horizontally supported by one of the plurality of horizontal support means
         wherein each wafer has an diameter of at least 200 mm, and
      raising the temperature of semiconductor wafers to at least 1000° C. for at least 15 minutes.

14. The process of claim 13 wherein the temperature of the wafers is raised to at least 1200° C. for at least 30 minutes.

* * * * *